(12) United States Patent
Anderson et al.

(10) Patent No.: US 8,933,490 B2
(45) Date of Patent: Jan. 13, 2015

(54) STRUCTURE, METHOD AND SYSTEM FOR COMPLEMENTARY STRAIN FILL FOR INTEGRATED CIRCUIT CHIPS

(71) Applicant: International Business Machines Corporation, Armonk, NY (US)

(72) Inventors: Brent A. Anderson, Jericho, VT (US); Edward J. Nowak, Essex Junction, VT (US); Jed H. Rankin, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 5 days.

(21) Appl. No.: 13/774,069

(22) Filed: Feb. 22, 2013

(65) Prior Publication Data
US 2013/0161748 A1  Jun. 27, 2013

Related U.S. Application Data

(62) Division of application No. 12/983,353, filed on Jan. 3, 2011, now Pat. No. 8,470,674.

(51) Int. Cl.
*H01L 27/118* (2006.01)
*H01L 27/12* (2006.01)
(Continued)

(52) U.S. Cl.
CPC .... *H01L 27/1203* (2013.01); *H01L 21/823807* (2013.01); *G06F 17/5081* (2013.01); *H01L 21/823412* (2013.01); *H01L 27/0207* (2013.01); *H01L 27/088* (2013.01); *H01L 27/092* (2013.01); *H01L 27/0922* (2013.01);
(Continued)

(58) Field of Classification Search
CPC ............ H01L 27/0922; H01L 21/8228; H01L 21/8238
USPC ........... 257/206, 274, 369, 351; 438/199, 275
See application file for complete search history.

(56) References Cited

U.S. PATENT DOCUMENTS 5,583,074 A    12/1996   Fuller et al.
7,335,545 B2    2/2008   Currie
(Continued)

OTHER PUBLICATIONS

Goh et al., Stress Engineering of Backend Metallization, Key Engineering Materials (vols. 306-308), pp. 1061-1066 (submitting 1 page).
(Continued)

*Primary Examiner* — Kimberly Rizkallah
*Assistant Examiner* — Maria Ligai
(74) *Attorney, Agent, or Firm* — Schmeiser, Olsen & Watts; Michael J. LeStrange

(57) ABSTRACT

A structure, method and system for complementary strain fill for integrated circuit chips. The structure includes a first region of an integrated circuit having multiplicity of n-channel and p-channel field effect transistors (FETs); a first stressed layer over n-channel field effect transistors (NFETs) of the first region, the first stressed layer of a first stress type; a second stressed layer over p-channel field effect transistors (PFETs) of the first region, the second stressed layer of a second stress type, the second stress type opposite from the first stress type; and a second region of the integrated circuit, the second region not containing FETs, the second region containing first sub-regions of the first stressed layer and second sub-regions of the second stressed layer.

12 Claims, 11 Drawing Sheets

(51) Int. Cl.
  *H01L 21/8238* (2006.01)
  *G06F 17/50* (2006.01)
  *H01L 21/8234* (2006.01)
  *H01L 27/02* (2006.01)
  *H01L 27/088* (2006.01)
  *H01L 27/092* (2006.01)
  *H01L 21/8228* (2006.01)
  *H01L 21/84* (2006.01)

(52) U.S. Cl.
  CPC ......... *H01L21/8228* (2013.01); *H01L 21/8238* (2013.01); *H01L 21/84* (2013.01)
  USPC ........... 257/206; 257/369; 257/351; 257/274; 438/199; 438/275

(56) References Cited

U.S. PATENT DOCUMENTS

| | | | |
|---|---|---|---|
| 7,465,620 B2 | 12/2008 | Ko et al. | |
| 7,476,579 B2 | 1/2009 | Zhu et al. | |
| 7,504,704 B2 | 3/2009 | Currie et al. | |
| 7,528,051 B2 | 5/2009 | Arghavani et al. | |
| 7,538,002 B2 | 5/2009 | Zhang et al. | |
| 7,635,620 B2 | 12/2009 | Chen et al. | |
| 7,700,448 B2 | 4/2010 | Futase et al. | |
| 2006/0105516 A1* | 5/2006 | Belyansky et al. | 438/199 |
| 2007/0108526 A1 | 5/2007 | Kohyama | |
| 2008/0246061 A1 | 10/2008 | Yang et al. | |
| 2009/0050979 A1* | 2/2009 | Kojima | 257/392 |
| 2012/0168866 A1 | 7/2012 | Anderson et al. | |

OTHER PUBLICATIONS

El-Masry et al., Criterion for suppressing wafer bow in heterostructures by selective epitaxy, vol. 14, issue 1, Jun. 1992, pp. 58-62 (submitting 1 page).
Lu et al., Wafer scale lead zirconate titanate film preparation by sol-gel method using stress balance layer, vol. 515, issue 4, Dec. 5, 2006, pp. 1506-1510 (submitting 1 page).
Zarbakhsh et al., Prediction of Wafer Bow through Thermomechanical Simulation of Patterned Hard Coated Copper Films, 978-1-4244-2128-2/08 © 2008 IEEE, pp. 1-5.
Yang et al., A New Technique for Producing Large-Area As-Deposited Zero-Stress LPCVD Polysilicon Films: The MultiPoly Process, IEEE Journal of Microelectromechanical Systems, vol. 9, No. 4, Dec. 2000, pp. 485-494.
Hebb et al., The Effect of Patterns on Thermal Stress During Rapid Thermal Processing of Silicon Wafers, IEEE Transactions on Semiconductor Manufacturing, vol. 11, No. 1, Feb. 1998, pp. 99-107.
Pang et al., Characterization and Management of Wafer Stress for Various Pattern Densities in 3D Integration Technology, 978-1-4244-6412-8/10 © 2010 Crown, pp. 1866-1869.
Ohno et al., Wafer Stress During Rapid Thermal Annealing Due to Surface Geometrical Patterns, VII-9, pp. 86 and 87.
Office Action (Mail Date Jul. 22, 2012) for U.S. Appl. No. 12/983,353, filed Jan. 3, 2011; Confirmation No. 1201.
Amendment filed Oct. 9, 2012 in response to Office Action (Mail Date Jul. 22, 2012) for U.S. Appl. No. 12/983,353, filed Jan. 3, 2011; Confirmation No. 1201.
Notice of Allowance (Mail Date Feb. 19, 2013) for U.S. Appl. No. 12/983,353, filed Jan. 3, 2011; Confirmation No. 1201.

* cited by examiner

STRUCTURE, METHOD AND SYSTEM FOR COMPLEMENTARY STRAIN FILL FOR INTEGRATED CIRCUIT CHIPS

RELATED APPLICATIONS

The present Application is a division of U.S. patent application Ser. No. 12/983,353 filed on Jan. 3, 2011, now U.S. Pat. No. 8,470,674, issued Jun. 25, 2013.

FIELD OF THE INVENTION

The present invention relates to the field of integrated circuits; more specifically, it relates to structure, method and system for complementary strain fill for integrated circuit chips.

BACKGROUND

In modern integrated circuit chips, different regions of the chip may have different amounts of strain induced into different regions of the substrate in which devices such as field effect transistors are fabricated. As the dimensions of the devices have decreased so has the misalignment tolerance between the mask images of different masking levels used to fabricate the various devices and interconnect structures of the integrated circuit chip. The strain induced into the substrate can often be non-uniform enough across an integrated circuit chip to cause local image placement errors between some of the existing structures on previously fabricated levels and some of the mask images on the mask being used to define structures of a current fabrication level. Image placement errors can lead to yield loss during fabrication and poor reliability of the completed integrated circuits chips. Accordingly, there exists a need in the art to mitigate or eliminate the deficiencies and limitations described hereinabove.

SUMMARY

A first aspect of the present invention is a structure, comprising: a first region of an integrated circuit having a multiplicity of n-channel and p-channel field effect of transistors (FETs); a first stressed layer over n-channel field effect transistors (NFETs) of the first region, the first stressed layer of a first stress type; a second stressed layer over p-channel field effect transistors (PFETs) of the first region, the second stressed layer of a second stress type, the second stress type opposite from the first stress type; and a second region of the integrated circuit, the second region not containing FETs, the second region containing first sub-regions of the first stressed layer and second sub-regions of the second stressed layer.

A second aspect of the present invention is a method, comprising: forming a first region of an integrated circuit having a multiplicity of n-channel and p-channel field effect of transistors (FETs); forming a first stressed layer over n-channel field effect transistors (NFETs) of the first region, the first stressed layer of a first stress type; forming a second stressed layer over p-channel field effect transistors (PFETs) of the first region, the second stressed layer of a second stress type, the second stress type opposite from the first stress type; and forming a second region of the integrated circuit, the second region not containing FETs, the second region containing first sub-regions of the first stressed layer and second sub-regions of the second stressed layer.

A third aspect of the present invention is a computer system comprising a processor, an address/data bus coupled to the processor, and computer-readable memory device coupled to communicate with the processor, the memory device containing instructions that when executed by the processor implement a method for complementary strain fill for integrated circuit chips, the method comprising the computer implemented steps of, comprising: designing an integrated circuit chip; designing tensile and compressive layer etch photomasks; identifying active regions of an integrated circuit having a multiplicity of n-channel and p-channel field effect of transistors (FETs); identifying inactive regions of the integrated circuit not containing FETs; placing fill shapes in the tensile and compressive layer etch mask designs, the fill shapes placed only in regions of the tensile and compressive layer etch photomask designs corresponding to the inactive sub-regions; and storing the tensile and compressive etch mask designs on a computer readable device.

These and other aspects of the invention are described below.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION

Figure 1:
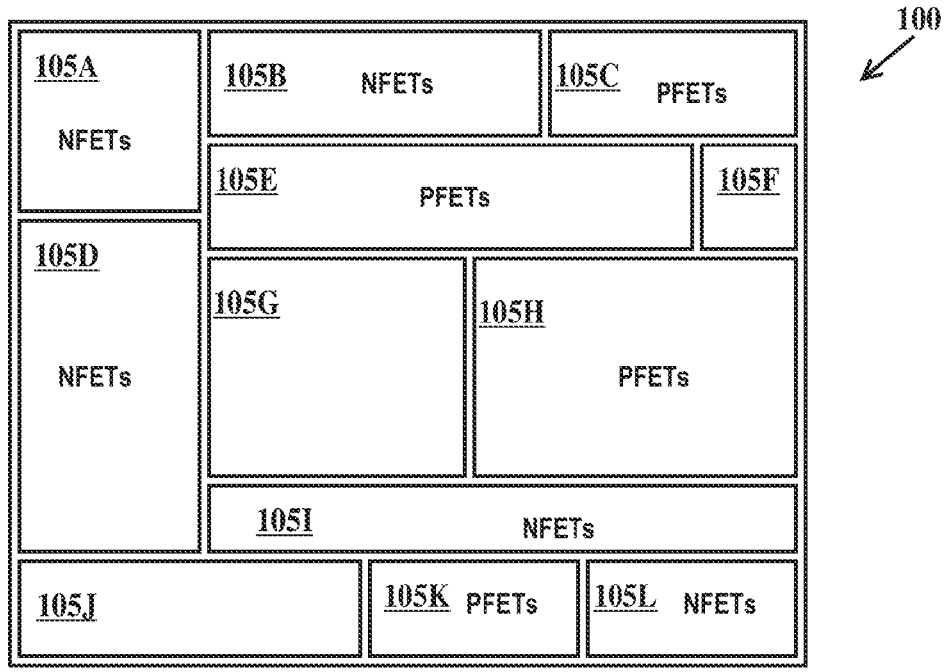
FIG. 1 is top view of an integrated circuit chip according to embodiments of the present invention.

The present invention embeds layers of opposite stress over inactive regions of an integrated circuit chip into stressed layers formed over an integrated circuit chip in order to make the strain in different regions of the integrated circuit chip more uniform. This reduces localized errors in photomask (e.g., reticles) alignment as described infra. In one example, inactive regions are regions where less than 10% of the area of the region contains active circuit devices (field effect transistors are examples of active circuit devices). In one example, inactive regions are regions that contain no active circuit devices. In one example, active regions are regions where greater than 70% of the area of the region contains active circuit devices.

Stress is a measure of the average amount of force exerted per unit area. Stress is a measure of the intensity of the total internal forces acting within a body across imaginary internal surfaces, as a reaction to external applied forces and body forces. Strain is the geometrical expression of deformation caused by the action of stress on a physical body. Young's modulus (E) is a measure of stiffness. It is defined as the ratio, for small strains, of the rate of change of stress with strain. In N-channel field effect transistors (NFETs), the mobility of the majority carriers, electrons, is greater (hole mobility is less) when the channel is in tensile stress in the direction of current flow. In P-channel field effect transistors (PFETs) the mobility of the majority carriers, holes, is greater (electron mobility is less) when the channel region is in compressive stress in the direction of current flow. Increasing the mobility of majority carriers increases the performance of the device. Therefore, tensile stressed layers are formed on NFETs and compressive stressed layers are formed on PFETs. Since the density of NFETs and PFETs varies locally across an integrated circuit chip, the stress hence the strain also varies locally. Strain can offset physical structures from their designed locations. This causes placement errors as images on subsequent photomasks no longer align to the previously defined structures.

A photolithographic process is one in which a photoresist layer is applied to a surface of a substrate (e.g., integrated circuit chip), the photoresist layer exposed to actinic radiation through a patterned photomask (opaque images in a clear field or clear images in an opaque field) that has been aligned to target marks on the substrate and the exposed photoresist layer developed to form a patterned photoresist layer. Alignment involves aligning registration images on the photomask to the target marks on the substrate. After processing (e.g., etching or ion implantation), the patterned photoresist is removed. Some images on the photomask may not register to corresponding images on the integrated circuit chip because those images have been offset from designed locations by non-uniform strain as described supra even though the registration images align perfectly to the target marks.

An example is contact level, which defines the locations of contacts to the source/drains, gates of FETs. If the source/drains or gates are not where they are expected to be based on the design grid because strain has displaced them, the contact openings in local regions will be etched in offset locations relative to the source/drains causing some contacts to contact structures they should not contact.

FIG. 1 is top view of an integrated circuit chip according to embodiments of the present invention. In FIG. 1, an integrated circuit chip 100 is divided into regions 105A, 105B, 105C, 105D, 105E, 105F, 105G, 105H, 105I, 105J, 105K and 105L. A region where NFETs predominate is defined as a region where greater than a preset target percentage of all FETs are NFETs. A region where PFETs predominate is defined as a region where greater than the preset target percentage of all FETs are PFETs. A region where neither NFETs nor PFETs are the predominate type of FET is defined as a region where the percentage of neither NFETs nor PFETs exceed the preset target percentage of all FETs. In one example, the preset target percentage is about 70%. In the example of FIG. 1, in regions 105A, 105B, 105D, 105I, and 105L NFETs predominate (designated by the label "NFETs"). In regions 105C, 105E, 105H and 105K PFETs predominate (designated by the label "PFETs"). In regions 105F, 105G and 105J neither NFETs nor PFETs predominate. A given region can be (i) active or inactive and (ii) NFET predominate or PFET predominate or neither NFET nor PFET predominant. Thus there are six possible combinations. To simplify the descriptions of the embodiments of the present invention, regions 105A, 105B, 105D, 105I and 105L are active and predominate NFET regions, regions 105C, 105E, 105H and 105K are active and predominate PFET regions and regions 105F, 105G and 105J are inactive regions.

Because NFETs predominate in regions 105A, 105B, 105D, 105I, and 105L, the average amount of strain is due to the larger areas of tensile stress layer compared to compressive stress layer in sub-regions 105A, 105B, 105D, 105I, and 105L. Because PFETs predominate in sub-region 105B, 105E, 105H, and 105K the average amount of strain is due to the larger areas of compressive stress layer compared top tensile stress layer in sub-regions 105B, 105E, 105H and 105K. The average strain in sub-regions 105F, 105G and 105J will often be lower compared to regions 105A, 105B, 105C, 105D, 105E, 105H, 105I, 105K and 105L because neither areas of compressive nor tensile stress layers predominate to the same extent as in regions 105A, 105B, 105C, 105D, 105E, 105H, 105I, 105K and 105L. Further, the absolute value of stress in tensile stressed layers may be different than that in compressive stressed layers. The point is strain is not uniform from region to region or even within sub-regions of regions 105A, 105B, 105C, 105D, 105E, 105F, 105G, 105H, 105I, 105J, 105K and 105L as discussed infra.

The average strain in a region may be roughly determined by $$S_{AV} \propto [(S_T \times A_T) + (S_C + A_C)]/2 \quad (1)$$

where
$S_{AV}$ is the average strain in a region;
$S_T$ is the amount of stress in the tensile layer;
$A_T$ is the area of the tensile stress layer;
$S_C$ is the amount of stress in the compressive layer; and
$A_C$ is the area of the compressive stress layer.

It will be appreciated in the description that follows, a predominately NFET region will be used as an example, but that the invention applies equally to predominately PFET regions, by substituting PFET for NFET, NFET for PFET, tensile for compressive and compressive for tensile.

Figure 2:
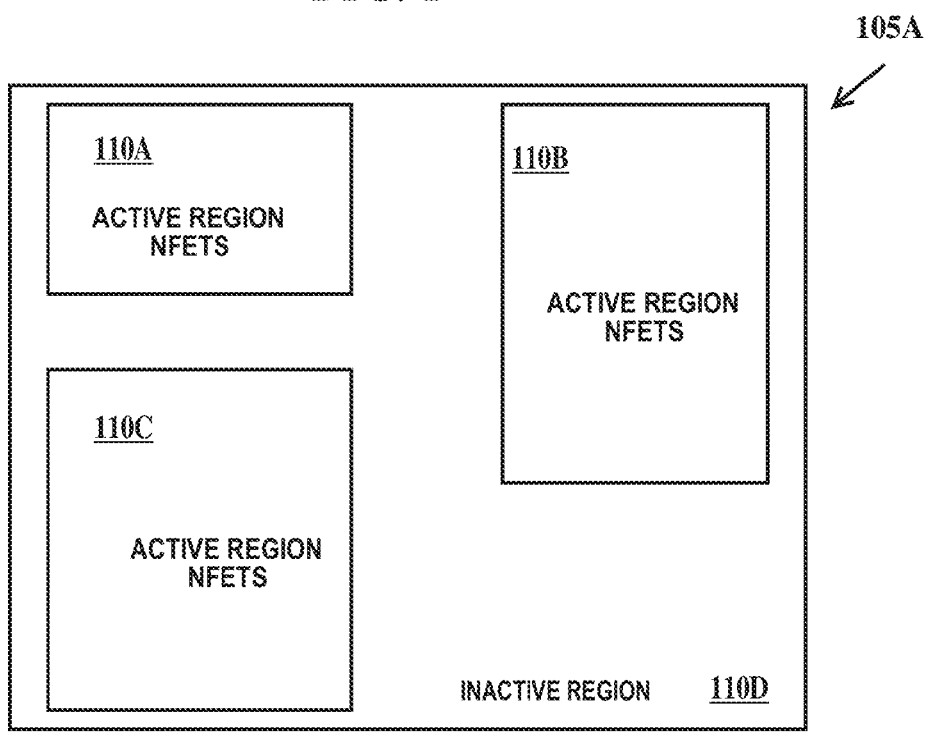
FIG. 2 is an enlarged view of a sub-region of the integrated circuit chip of FIG. 1 before stressed layers are applied.

FIG. 2 is an enlarged view of region 105A of the integrated circuit chip of FIG. 1 before stressed layers are applied. Region 105A includes sub-regions 110A, 110B, 110C and 110D. Sub-regions 110A, 110B and 110C are active regions that include predominately NFETs (there may be PFETs present as well) and are labeled "ACTIVE". Sub-region 110D is an inactive region that contains neither NFETs nor PFETs or contains a very small numbers of NFETs and/or PFETs, e.g., less than about 10% of the area of the region contains NFETs and/or PFETs which may be widely scattered and is labeled "INACTIVE."

Figure 3:
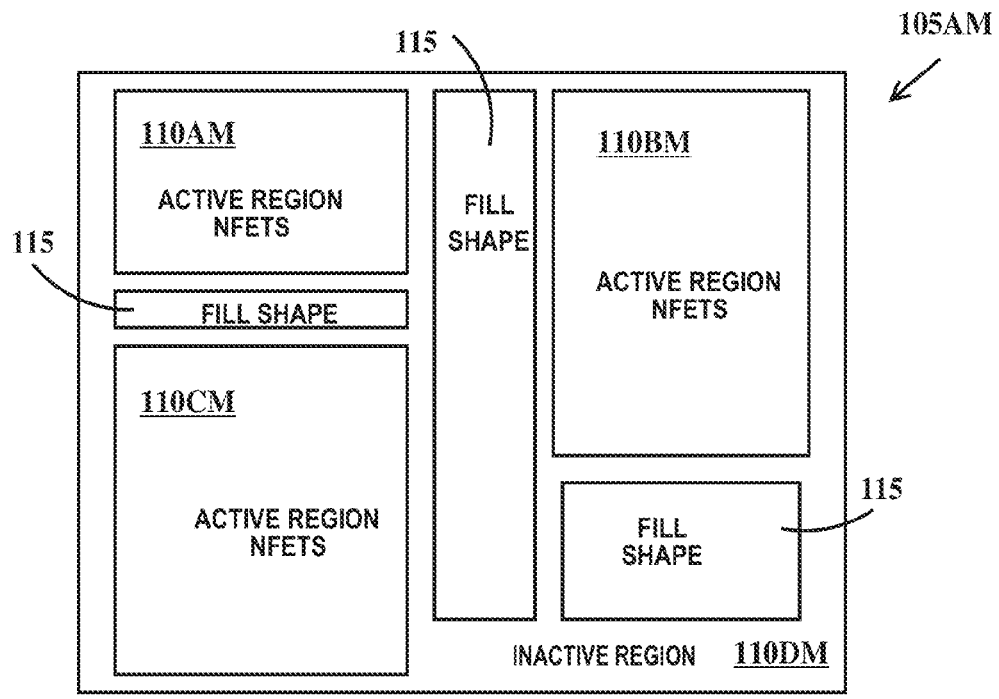
FIG. 3 is an enlarged view of a region of a photomask having fill shapes corresponding to the region of the integrated circuit chip illustrated in FIG. 3 according to embodiments of the present invention.

FIG. 3 is an enlarged view of region of a photomask having fill shapes corresponding to the region of the integrated circuit chip illustrated in FIG. 2 according to embodiments of the present invention. In FIG. 3, a photomask region 105AM corresponding to region 105A includes sub-regions 110AM, 110BM, 110CM and 110DM corresponding to sub-regions 110A, 110B, 110C, 110D of FIG. 2. Region 105M includes fill shapes 115 within inactive sub-region 110DM. Fill shapes 115 define areas where tensile nitride will be removed and compressive nitride formed. There is also a complimentary photomask similar to the photomask of FIG. 3 but of opposite polarity having fill shapes that define the extent of the compressive nitride over sub-region 110D of FIG. 2. See, for example, FIGS. 8A through 8H and description infra.

Figure 4:
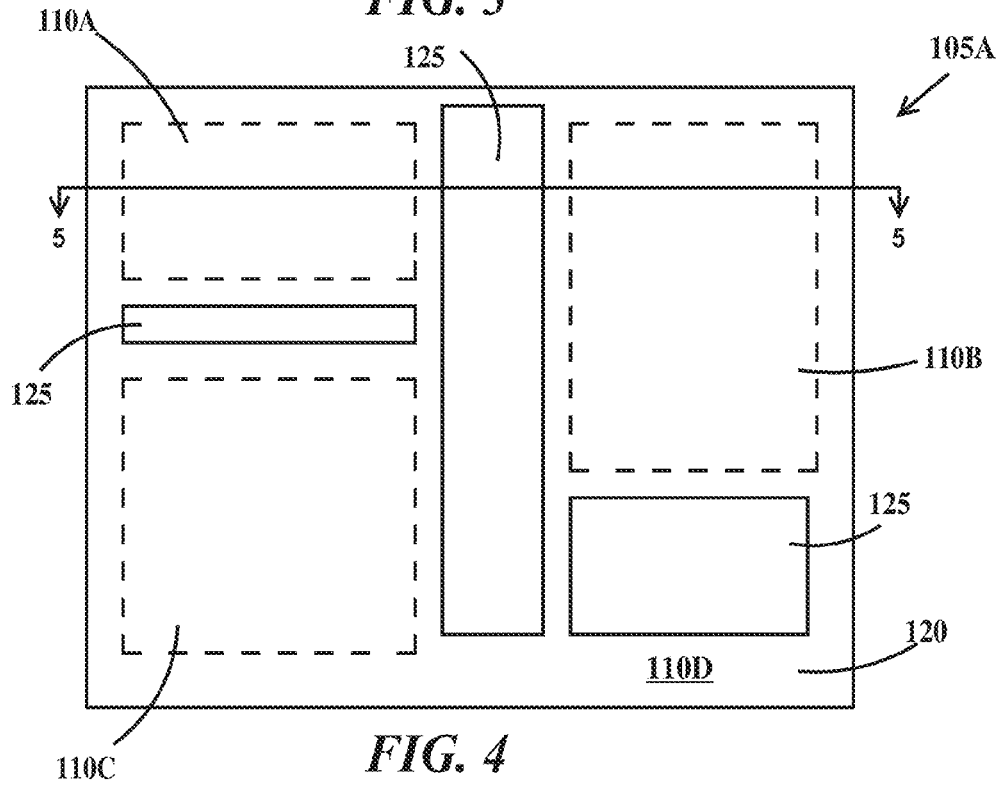
FIG. 4 is an enlarged view of the region of the integrated circuit chip illustrated in FIG. 2 after processing according to embodiments of the present invention.

FIG. 4 is an enlarged view of the region of the integrated circuit chip illustrated in FIG. 2 after processing according to embodiments of the present invention. In FIG. 4, a tensile stressed layer 120 and a compressive stressed layer 125 are formed over region 105A. Layer 120 extends over regions 110A, 110B and 110C and overlaps region 110D along the perimeters of regions 110A, 110B and 110C. Layer 120 may include regions of compressive stressed layers (e.g., over PFETs) in sub-regions 110A, 110B and 110C (see FIG. 6). Layer 125 extends over portions of sub-region 110D corresponding to fill shapes 115 of FIG. 3. Because of the average stress of regions 125 is the opposite of the average stress of regions 120, the average strain in region 105A is lower than would otherwise be without region 125 and the strain in region 105A is more uniform thus reducing image placement errors.

Figure 5:
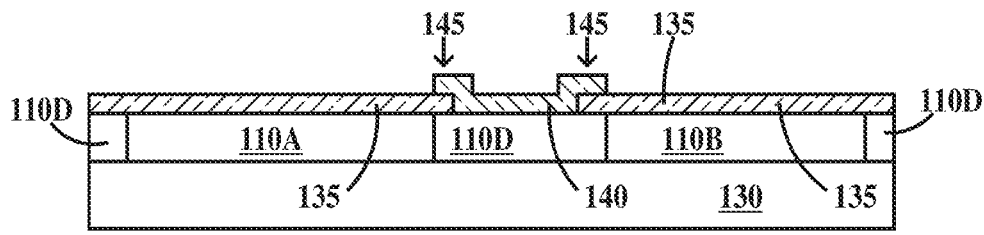
FIG. 5 is a cross-sectional view through line 5-5 of FIG. 4.
Figure 6:
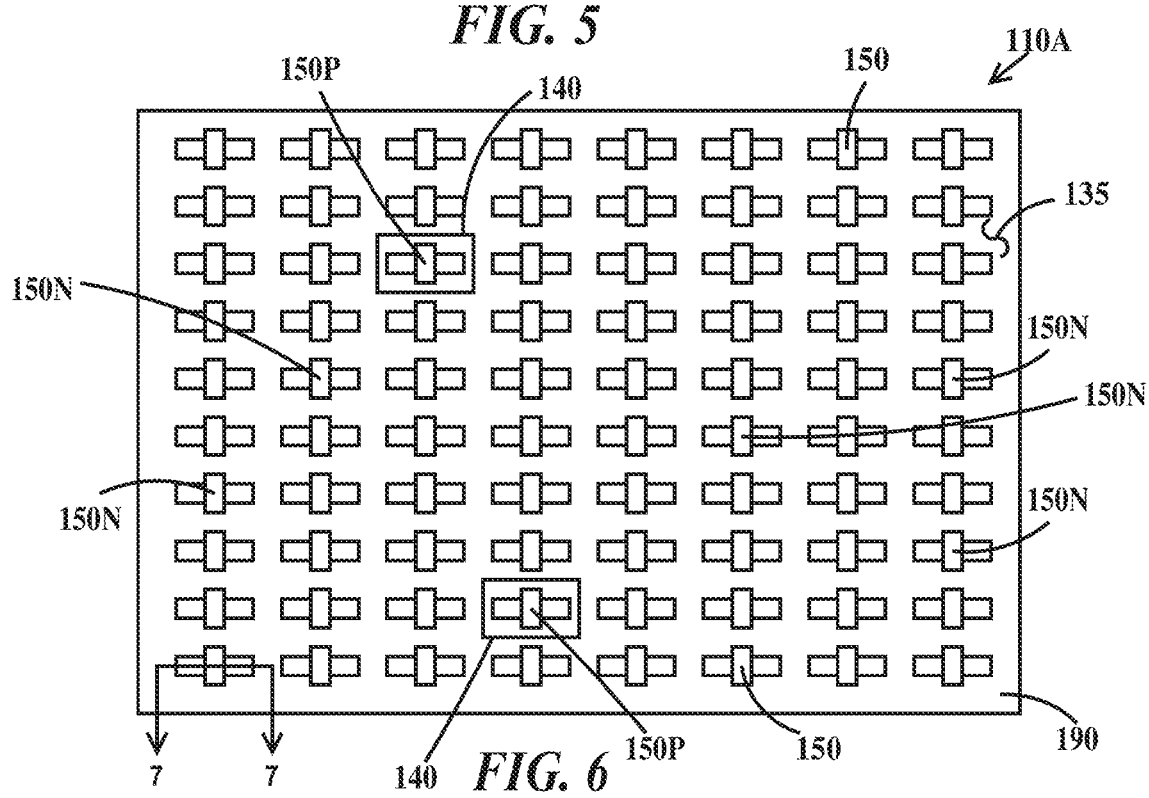
FIG. 6 is a plan view of a sub-region of the integrated circuit chip illustrated in FIG. 5.

FIG. 5 is a cross-sectional view through line 5-5 of FIG. 4. In FIG. 5, a substrate 130 includes sub-regions 110A and 110B. A dielectric tensile stressed layer 135 has been formed over sub-regions 110A and 110B and overlapping region 110D. A dielectric compressive stressed layer 140 has been formed over sub-region 110D. Layers 135 and 140 overlap in regions 145. There may be regions of layer 140 over sub-regions 110A and 110B (not shown because of the scale of FIG. 5) but as illustrated in FIG. 6. In one example substrate 130 is a single-crystal silicon substrate. In one example substrate 130 is a silicon-on-insulator (SOI) substrate comprising a single crystal silicon layer separated from a supporting substrate by a buried oxide (BOX) layer and regions 105A through 105L of integrated circuit chip 100 (see FIG. 1) are formed in the silicon layer.

FIG. 6 is a plan view of a sub-region of the integrated circuit chip illustrated in FIG. 5. In FIG. 6, sub-region 110A includes NFETs 150N covered only by tensile layer 135 and optional PFETs 150P covered only by compressive layer 140.

Figure 7:
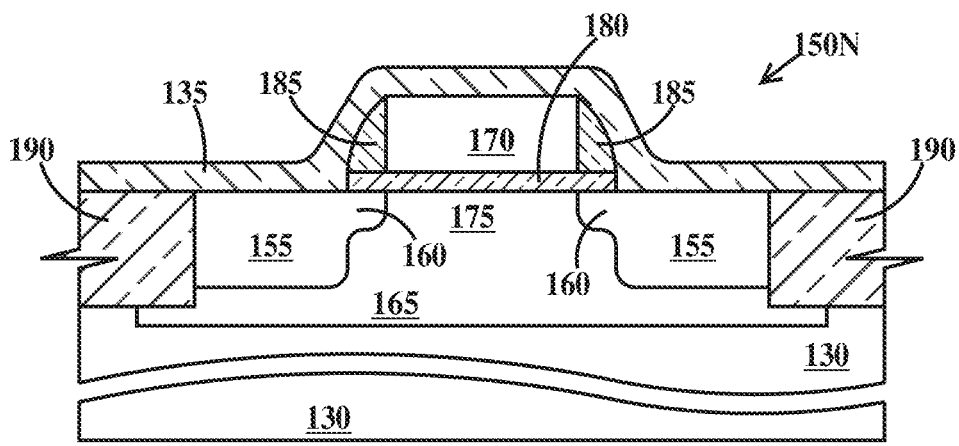
FIG. 7 is cross-section through line 7-7 of FIG. 6 illustrating a typical field effect transistor.

FIG. 7 is cross-section through line 7-7 of FIG. 6 illustrating a typical field effect transistor. In FIG. 7 a typical NFET 150N includes N-type source/drains 155 having N-type source/drain extensions 160 in a P-well 165 of substrate 160 and a gate electrode 170 over a channel region 175 in P-well 165 between source/drain extensions 175. Gate electrode 170 is separated from source/drains 155, source/drain extensions 160 and channel region 175 by a gate dielectric 180. Optional dielectric sidewall spacers 185 are formed on opposite sides of gate electrode 170. Tensile layer 135 is formed over NFET 150N. NFET 150N is isolated by trench isolation 190 formed in substrate 130. For a PFET, the source/drains and source/drain extensions would be P-type and formed in an N-well.

Figure 8A:
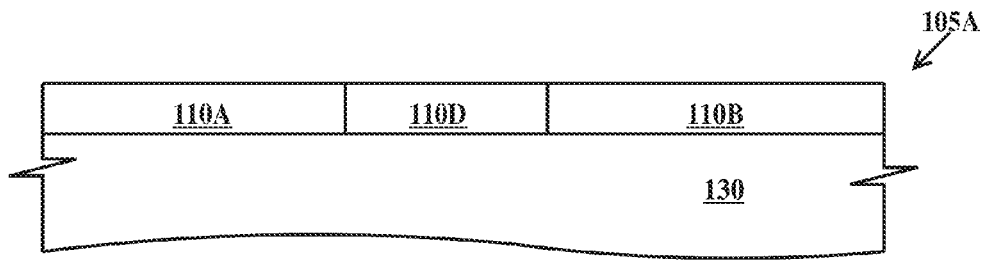
FIGS. 8A through 8H are cross-sectional views illustrating steps in the fabrication of an integrated circuit chip according to embodiments of the present invention.

FIGS. 8A through 8H are cross-sectional views illustrating steps in the fabrication of an integrated circuit chip according to embodiments of the present invention. In FIG. 8A, sub-regions 110A, 110B and 110D have been formed in region 105A substrate 130. Sub-regions 110A and 110B include, for example, PFETs, NFETs and trench isolation. but are dominated by NFETs.

Figure 8B:
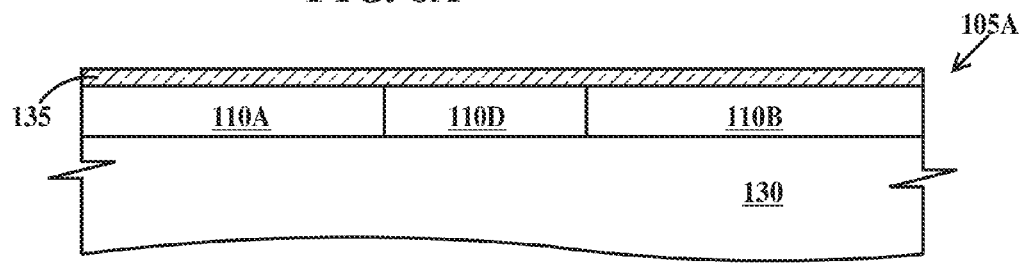

In FIG. 8B, tensile stressed layer 135 is formed on sub-regions 110A, 110B and 110D. In one example, tensile stressed layer 135 is silicon nitride ($Si_3N_4$). In one example, a tensile stressed $Si_3N_4$ layer is formed by low-pressure chemical vapor deposition (LPCVD) using silane ($SiH_4$) and ammonia ($NH_3$) precursor gases. In one example, tensile stressed layer 135 is between about 50 nm and about 100 nm thick. In one example, the amount of tensile stress is between about 0.5 GPa and about 4 GPa.

Figure 8C:
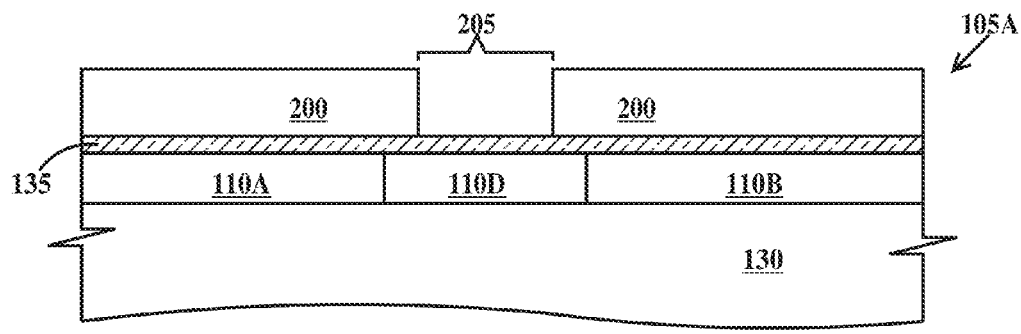

In FIG. 8C, a patterned photoresist layer 200 is formed on tensile stressed layer 135 having an opening 205 over sub-region 110D. Opening 205 was defined by fill shape 115 of FIG. 3.

Figure 8D:
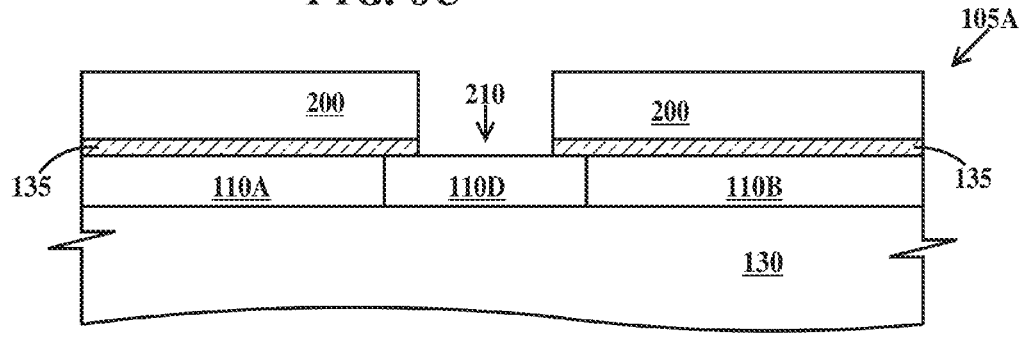

In FIG. 8D, tensile stressed layer 135 is removed (e.g., by wet or reactive ion etch (RIE)) to form a trench 210 completely through stressed layer 135 over sub-region 110D.

Figure 8E:
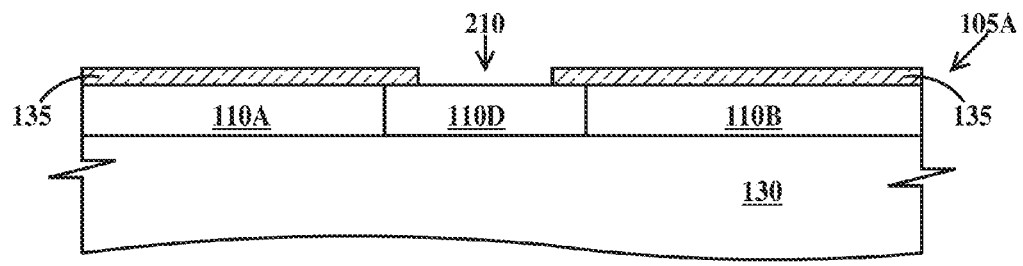

In FIG. 8E, patterned photoresist layer 200 (see FIG. 8D) is removed.

Figure 8F:
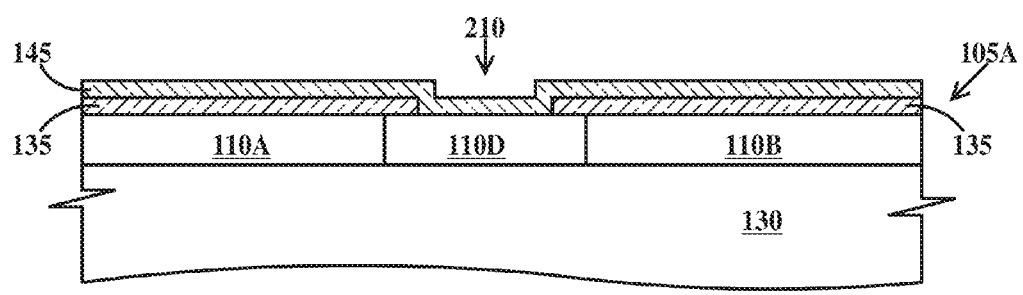

In FIG. 8F, compressive stressed layer 140 is formed on tensile stressed layer 135 and on sub-region 110D in trench 210. In one example, compressive stressed layer 140 is $Si_3N_4$. In one example, a compressive stressed $Si_3N_4$ layer is formed by high density plasma (HDP) deposition or plasma enhanced chemical vapor deposition (PECVD) using $SiH_4$, $NH_3$ and nitrogen ($N_2$) precursor gases. In one example, a compressive stressed layer 140 is between about 60 nm and about 120 nm thick. In one example, the amount of compressive stress is between about 0.5 GPa and about 4 GPa.

Figure 8G:
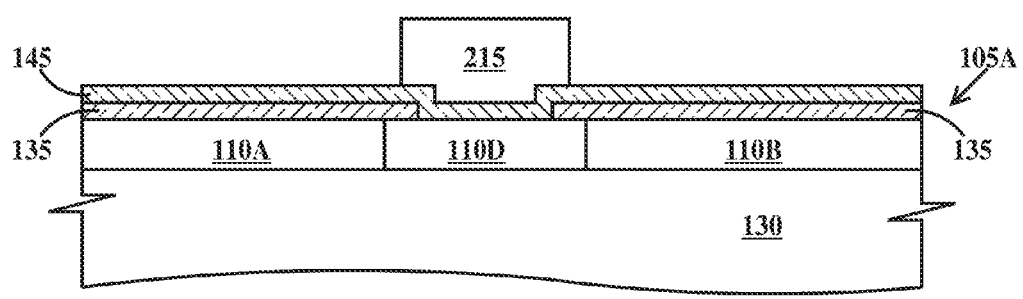

In FIG. 8G, a patterned photoresist layer 215 is formed on compressive stressed layer 140 having over sub-region 110D. Patterned photoresist layer 215 was defined by a complimentary (opposite polarity) photomask having a similar photomask fill shape to that of photomask fill shape 115 of FIG. 3.

Figure 8H:
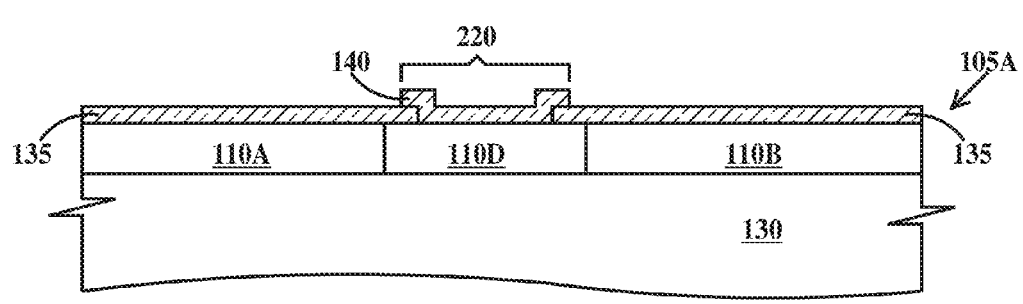

In FIG. 8H, compressive stressed layer 140 is removed (e.g., by wet or RIE) where not protected by patterned photoresist layer 215 (see FIG. 8G) to form an island 220 of compressive stressed layer 140 on sub-region 110D. Patterned photoresist layer 215 (see FIG. 8G) is also removed.

It will be apparent to one of ordinary skill in the art that the order of deposition and patenting of tensile layer 135 and compressive layer 140 may be reversed, however deposition and patterning of tensile stressed films is preferred.

Figure 9:
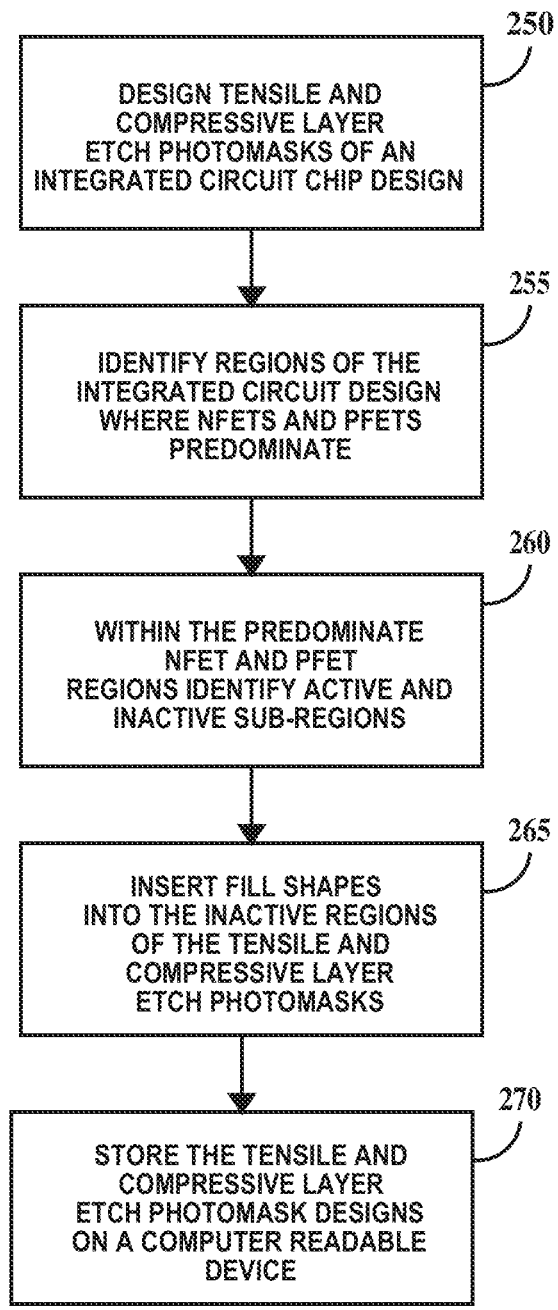
FIG. 9 is a flowchart of a method for designing photomasks according to embodiments of the present invention.

FIG. 9 is a flowchart of a method for designing photomasks according to embodiments of the present invention. In step 250, the complimentary photomasks of an integrated circuit design that define the extents of the tensile and compressive layers are designed.

In step 255, regions of the integrated circuit design where NFETs (and thus tensile stress) predominate and where PFETs (and thus compressive stress) predominate are identified. The photomask data from step 250 may be used or other design data that defines locations of NFETs and PFETs may be used.

In step 260, the regions of step 255 are grouped into active sub-regions (sub-regions that contain FETs) and inactive sub-regions (sub-regions that do not contain FETs) as illustrated in FIG. 2.

In step 265, fill shapes are inserted into the inactive regions of the compressive and tensile layer etch mask designs as illustrated in FIG. 3. Fill shapes are placed in inactive regions of the tensile layer etch photomask design when NFETs predominate and in inactive regions of the compressive layer etch photomask design when PFETs predominate. Fill shapes are placed in inactive regions of the compressive layer etch photomask design when PFETs predominate and in inactive regions of the tensile layer etch photomask design when NFETs predominate. Fill shapes define areas of stress layers to be removed.

In step 270, the tensile and compressive photomask etch mask designs are stored on a computer readable storage medium or device as mask fabrication datasets (e.g., netlists and/or shapes files). Netlist and shapes files impart a logical and physical structure to the storage medium as specific data for fabricating specific structures are located in specific locations on the medium. Actual tensile and compressive layer etch photomasks may be fabricated using the mask fabrication datasets.

Figure 10:
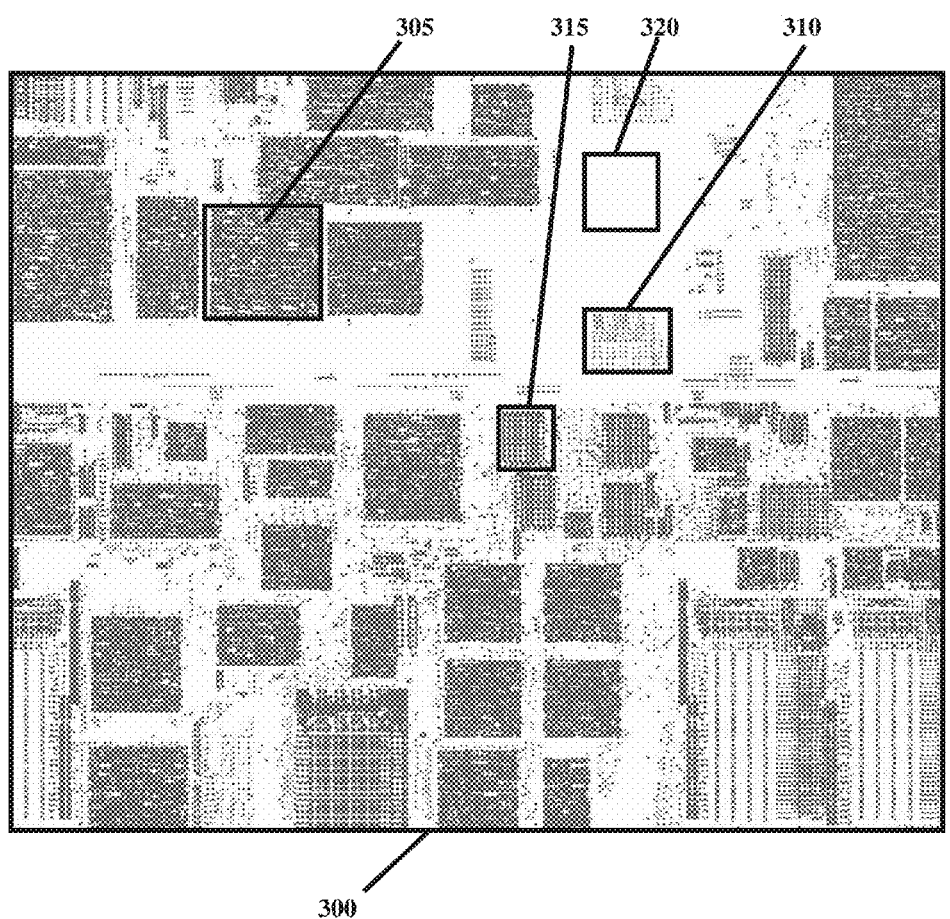
FIG. 10 is plan view of an actual integrated circuit chip illustrating how different regions are populated with field effect transistors.

FIG. 10 is plan view of an actual integrated circuit chip 300 illustrating how different regions are populated with field effect transistors. In FIG. 10, dark areas are NFETs and clear regions are PFETs. An exemplary region 305 is dominated by NFETs. An exemplary region 310 is dominated by PFETs. An exemplary region 315 is not dominated by NFETs or PFETs. An exemplary region 320 contains neither NFETs or PFETs or contains a very small number of NFETs and/or PFETs, e.g., less than about 10% of the area of the region contains NFETs or PFETs) which may be widely scattered. For regions having no NFETs or PFETs or very small numbers of NFETs and PFETs, a slightly different method is required as is now explained.

Figure 11:
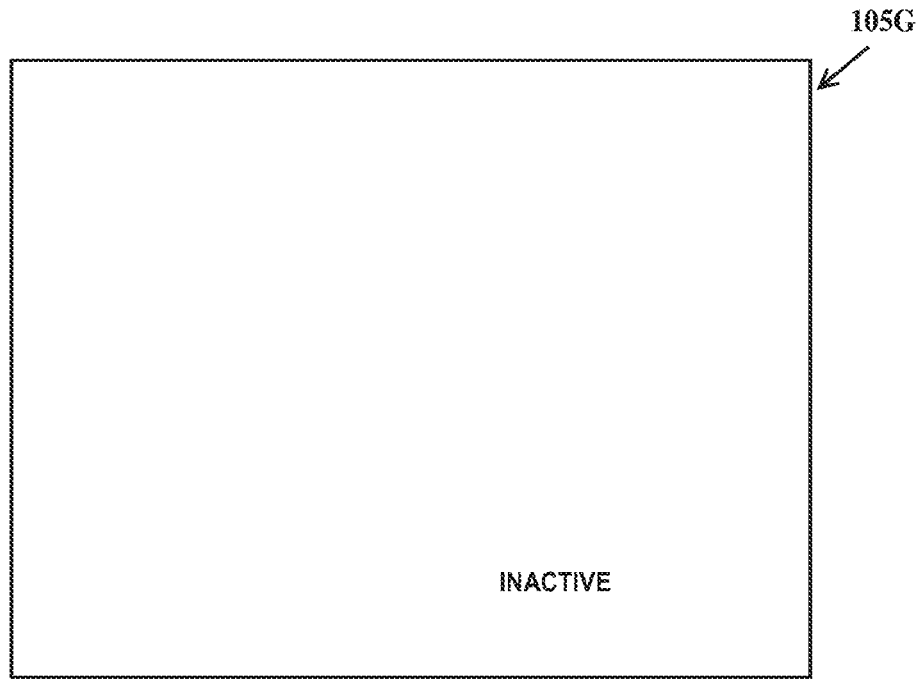
FIG. 11 is an enlarged view of another sub-region of the integrated circuit chip of FIG. 1 before stressed layers are applied.

FIG. 11 is an enlarged view of region 105G of the integrated circuit chip of FIG. 1 before stressed layers are applied. Region 105G contains neither NFETs or PFETs or contains a very small number of NFETs and/or PFETs, e.g., less than about 10% of the area of the region contains NFETs or PFETs) which may be widely scattered. In the initial integrated circuit design, region 105G may be entirely compressive stressed or entirely tensile stressed. However, if there are NFETs in region 105G, there may be a tensile stress layer over the NFETs and a compressive stress layer over the rest of region 105G so compressive stress is the predominate stress layer in the region. Likewise, if there are PFETs in region 105G, there may be a compressive stress layer over the PFETs and a tensile stress layer over the rest of region 105G so tensile stress is the predominate stress layer in the region. Compressive and tensile stress layers may comprise silicon nitride.

Figure 12:
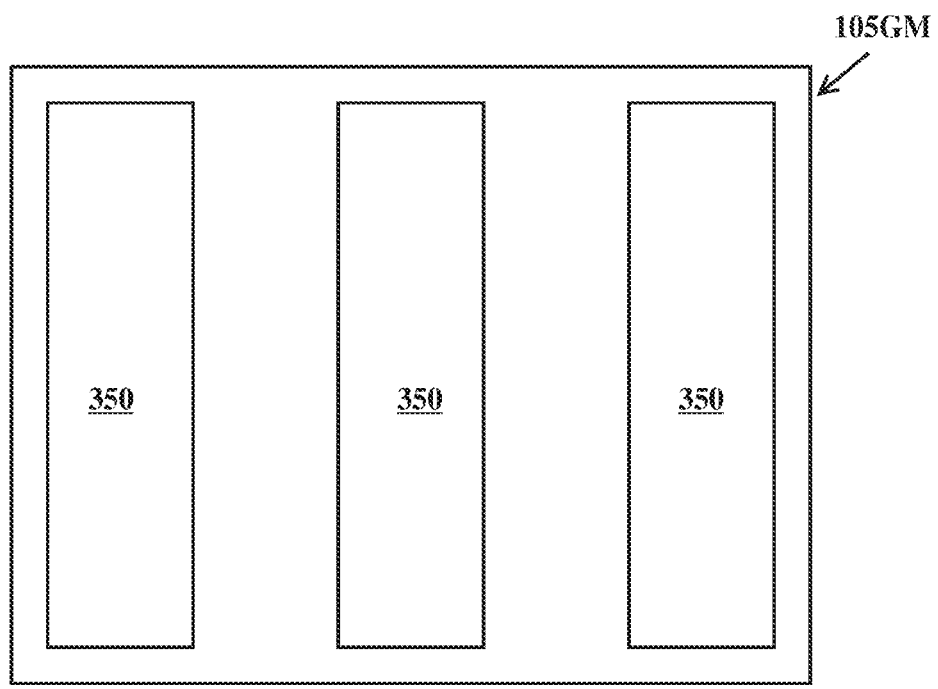
FIG. 12 is an enlarged view of a region of a photomask having fill shapes corresponding to the region of the integrated circuit chip illustrated in FIG. 11 according to embodiments of the present invention.

FIG. 12 is an enlarged view of region of a photomask having fill shapes corresponding to the region of the integrated circuit chip illustrated in FIG. 11 according to embodiments of the present invention. In FIG. 12, a photomask region 105GM corresponding to region 105G having fill shapes 350 is shown. When region 105G is initially designed with a tensile stress layer (or a tensile stress layer predominates), fill shapes 350 define areas where the tensile layer will be removed and a compressive layer formed. There is also a complimentary photomask similar to the photomask of FIG. 12 but of opposite polarity having fill shapes that define the extent of the compressive layer over region 105G of FIG. 11.

When region 105G is initially designed compressive stress layer (or a compressive stress layer predominates), fill shapes 350 define areas where the compressive layer will be removed and a tensile layer formed. There is also a complimentary photomask similar to the photomask of FIG. 12 but of opposite polarity having fill shapes that define the extent of the tensile layer over sub-region 105G of FIG. 11.

Figure 13:
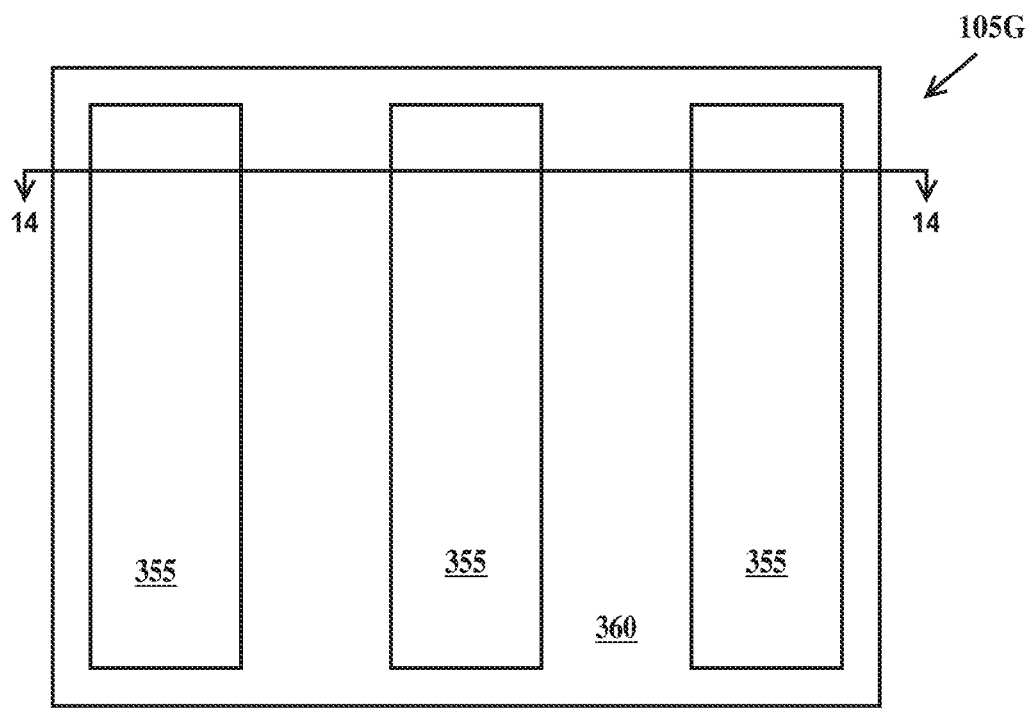
FIG. 13 is an enlarged view of the region of the integrated circuit chip illustrated in FIG. 11 after processing according to embodiments of the present invention.

FIG. 13 is an enlarged view of the region of the integrated circuit chip illustrated in FIG. 11 after processing according to embodiments of the present invention. In FIG. 13, oppositely stressed sub-regions 355 and sub-region 360 have been formed in region 105G. Because of the average stress of sub-region 355 is the opposite of the average stress of sub-region 360, the average strain in region 105G is lower than would otherwise be without sub-regions 355 and the strain in region 105G is more uniform thus reducing image placement errors.

Figure 14:
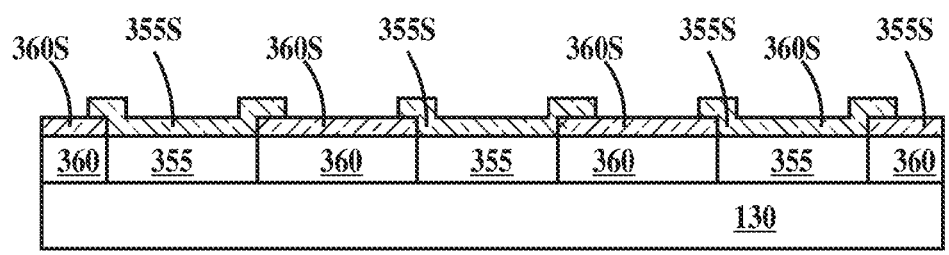
FIG. 14 is a cross-sectional view through line 14-14 of FIG. 13.

FIG. 14 is a cross-sectional view through line 14-14 of FIG. 13. In FIG. 14, a dielectric first type stressed layer 355S has been formed over sub-regions 355 and overlapping sub-region 360. A dielectric second and opposite type stressed layer 360S has been formed over sub-region 360. Layers 355S and 360S overlap.

Figure 15:
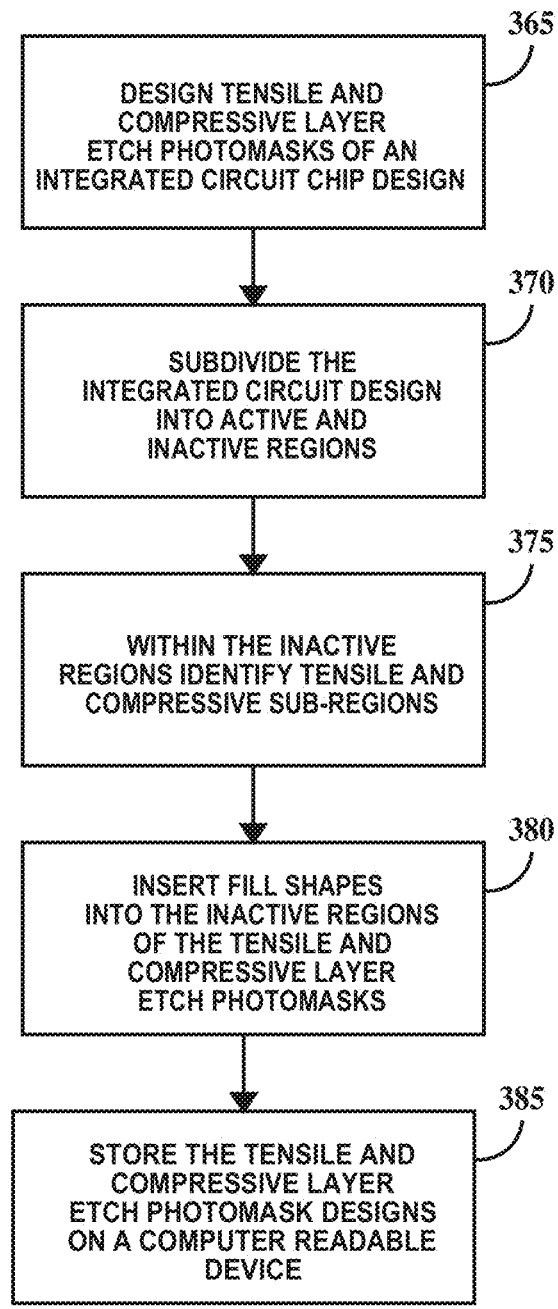
FIG. 15 is a flowchart of a method for designing photomasks according to embodiments of the present invention.

FIG. 15 is a flowchart of a method for designing photomasks according to embodiments of the present invention. In step 365, the complimentary photomasks of an integrated circuit design that define the extent of the tensile and compressive layers are designed.

In step 370, the integrated circuit design is divided into active and inactive regions. The photomask data from step 365 may be used or other design data that defines areas of no FETs or having low density FETs may be used.

In step 375, the regions of step 370 are grouped into tensile sub-regions and compressive sub-regions.

In step 380, fill shapes are inserted into the inactive regions of the compressive and tensile layer etch mask designs as illustrated in FIG. 12. Fill shapes define areas of stress layers to be removed.

In step 385, the tensile and compressive photomask etch mask designs are stored on a computer readable storage medium or device as mask fabrication datasets (e.g., netlists and/or shapes files). Actual tensile and compressive layer etch photomasks may be fabricated using the mask fabrication datasets.

It should be understood that the method described relative to FIGS. 9 and 15 may be practiced together on the same integrated circuit chip design or just one of the methods may be practiced.

Thus the embodiments of the present invention provide a structure having more uniform strain and method for fabricating structures with more uniform strain so as to reduce or eliminate strain induced image placement errors.

Generally, the method described herein with respect to designing photomasks for complementary strain fill for integrated circuit chips is practiced with a general-purpose computer and the methods described supra in the flow diagrams of FIG. 9 and FIG. 15 may be coded as a set of instructions on removable or hard media for use by the general-purpose computer.

Figure 16:
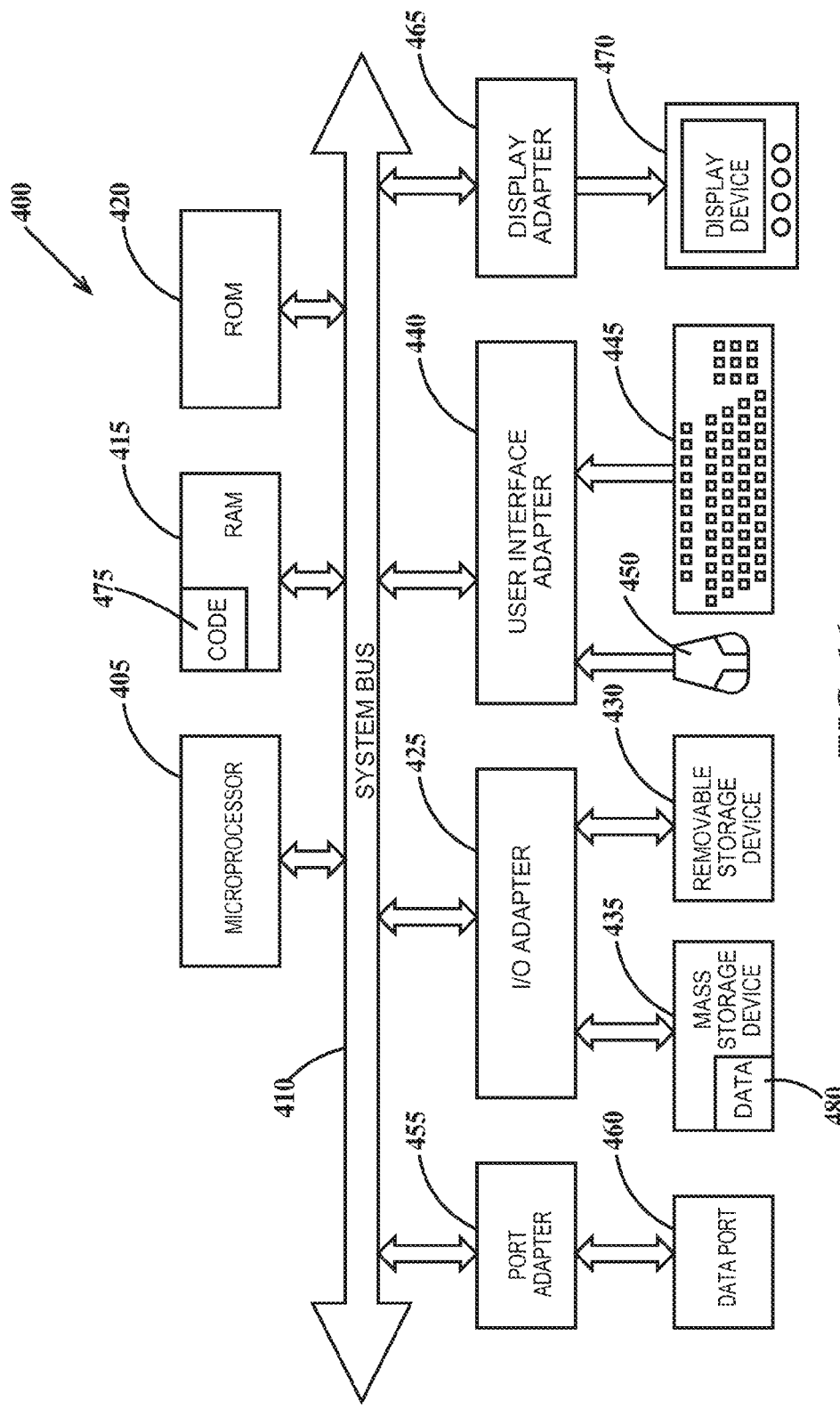
FIG. 16 is a schematic block diagram of a general-purpose computer.

FIG. 16 is a schematic block diagram of a general-purpose computer. In FIG. 16, computer system 400 has at least one microprocessor or central processing unit (CPU) 405. CPU 405 is interconnected via a system bus 410 to a random access memory (RAM) 415, a read-only memory (ROM) 420, an input/output (I/O) adapter 425 for connecting a removable data and/or program storage device 430 and a mass data and/or program storage device 435, a user interface adapter 440 for connecting a keyboard 445 and a mouse 450, a port adapter 455 for connecting a data port 460 and a display adapter 465 for connecting a display device 470.

ROM 420 contains the basic operating system for computer system 400. The operating system may alternatively reside in RAM 415 or elsewhere as is known in the art. Examples of removable data and/or program storage device 430 include magnetic media such as floppy drives and tape drives and optical media such as CD ROM drives. Examples of mass data and/or program storage device 435 include electronic, magnetic, optical, electromagnetic, infrared, and semiconductor devices. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD. In addition to keyboard 445 and mouse 450, other user input devices such as trackballs, writing tablets, pressure pads, microphones, light pens and position-sensing screen displays may be connected to user interface 440. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for the computer program created to run the present invention is loaded on the appropriate removable data and/or program storage device 430, fed through data port 460 or typed in using keyboard 445.

Thus, the embodiments of the present invention provide a method for designing photomasks for complementary strain fill for integrated circuit chips.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A structure, comprising:
   a first region of an integrated circuit having an unequal number of p-channel and re-channel field effect transistors (FETs);
   a first stressed layer over n-channel field effect transistors (NFETs) of said first region, said first stressed layer of a first stress type;
   a second stressed layer over p-channel field effect transistors (PFETs) of said first region, said second stressed layer of a second stress type, said second stress type opposite from said first stress type; and
   a second region of said integrated circuit, said second region not containing FETs, said second region containing first sub-regions of said first stressed layer surrounded by second sub-regions of said second stressed layer or said second region containing first sub-regions of said second stressed layer surrounded by second sub-regions of said first stressed layer.

2. The structure of claim 1 wherein greater than about 70% of the area of said first region contains FETs.

3. The structure of claim 1, wherein at least 70% of the FETs of said first region are NFETs said second stressed layer is formed over sub-regions of said first region not containing FETs.

4. The structure of claim 1, wherein (i) said NFETs comprise first source/drains on opposite sides of first channel regions formed in a silicon substrate or in silicon layer and first gate electrodes over and separated from said channel regions by a first gate dielectric layer and said first stressed layer is formed directly on said first source/drains and said first gate electrodes and (ii) said PFETs comprise second source/drains on opposite sides of second channel regions formed in a silicon substrate or in silicon layer and second gate electrodes over and separated from said channel regions by a second gate dielectric layer and second-stressed layer is formed directly on said second source/drains and said second gate electrodes.

5. The structure of claim 1, wherein said second stressed layer is formed in trenches in said first stressed layer or said first stressed layer is formed in trenches in said second stressed layer.

6. The structure of claim 1, wherein said first type of stress is tensile stress and said second type of stress is compressive stress.

7. The structure of claim 1, wherein said first stressed layer comprises tensile stressed silicon nitride and said second stressed layer comprises compressive stressed silicon nitride.

8. The structure of claim 1, wherein said first and second regions are regions of a single-crystal silicon substrate.

9. The structure of claim 1, wherein said first and second regions are a region of single-crystal silicon layer of a silicon-on-insulator (SOI) substrate comprising said single-crystal silicon layer separated from a supporting substrate by a buried oxide layer.

10. The structure of claim 1, wherein at least 70% of the FETs of said first region are PFETs and said first stressed layer is formed over sub-regions of said first region not containing FETs.

11. The structure of claim 1, wherein at least 70% of the FETs of said first region are NFETs and said second stressed layer is formed over sub-regions of said first region not containing FETs or at least 70% of the FETs of said first region are PFETs and said first stressed layer is formed over sub-regions of said first region not containing FETs.

12. The structure of claim 1, wherein said first stressed layer in said first region overlaps a perimeter of said second stressed layer in said second region or said second stressed layer in said first region overlaps a perimeter of said first stressed layer in said second region.

* * * * *